United States Patent [19]

Bourgeois et al.

[11] Patent Number: 5,444,380
[45] Date of Patent: Aug. 22, 1995

[54] CURRENT SURGE INDICATOR

[75] Inventors: Jean-Marc Bourgeois, Longueuil; Gilles Missout, Saint-Bruno; Francois Lalonde, Varennes; Jacques Belanger, Saint-Basile, all of Canada

[73] Assignee: Hydro-Quebec, Quebec, Canada

[21] Appl. No.: 224,500

[22] Filed: Apr. 7, 1994

Related U.S. Application Data

[63] Continuation-in-part of Ser. No. 5,456, Jan. 19, 1993, abandoned.

[51] Int. Cl.⁶ .......................................... G01R 31/02
[52] U.S. Cl. .................... 324/529; 324/133; 324/127; 340/664
[58] Field of Search ............. 324/529, 133, 117 R, 324/127, 527, 520, 522; 340/664; 361/88, 91, 111, 119

[56] References Cited

U.S. PATENT DOCUMENTS

| Re. 31,613 | 6/1994 | Lienhard et al. | 324/117 R |
|---|---|---|---|
| 2,345,430 | 3/1944 | Rich | 324/127 |
| 2,709,800 | 5/1955 | Temple et al. | 340/664 |
| 3,199,026 | 8/1965 | Leibowitz | 324/117 H |
| 3,375,510 | 3/1968 | Pitches | 324/133 |
| 3,434,052 | 3/1969 | Fechant | 324/127 |
| 3,528,009 | 7/1969 | Astrove | 324/133 |
| 4,414,543 | 11/1983 | Schweitzer, Jr. | 324/133 |
| 4,536,758 | 8/1985 | Schweitzer, Jr. | 324/133 |
| 5,014,043 | 5/1991 | Lopetrone et al. | 324/529 |
| 5,055,771 | 10/1991 | Gamble et al. | 324/133 |
| 5,153,565 | 10/1992 | Schweitzer, Jr. | 324/529 |
| 5,220,311 | 6/1993 | Scheitzer, Jr. | 324/133 |
| 5,221,894 | 6/1993 | Herwig | 324/133 |
| 5,287,087 | 2/1994 | Jencks et al. | 324/133 |

FOREIGN PATENT DOCUMENTS

| 715939 | 12/1941 | Germany | 340/664 |
|---|---|---|---|
| 1916567 | 10/1970 | Germany | 340/664 |
| 92817 | 12/1987 | Romania . | |
| 475429 | 11/1937 | United Kingdom | 340/664 |
| 695889 | 8/1953 | United Kingdom | 340/664 |
| 411396 | 5/1974 | U.S.S.R. . | |
| 1190313 | 11/1985 | U.S.S.R. . | |
| 1215068 | 2/1986 | U.S.S.R. . | |

*Primary Examiner*—Maura K. Regan
*Attorney, Agent, or Firm*—Foley & Lardner

[57] ABSTRACT

The current surge indicator (10) has a ferromagnetic member (12) held about a conductor (15) with the ends of the member (12) in proximity and facing each other such that the ends are attracted to one another with a given force as current passes through the conductor (15). When the force exceeds a given threshold, a signal is created to help in locating where the current surge took place. The member may be spring loaded to open up, and the signal may be provided by the member being released by the current surge such that the member falls from the conductor. The conductor may be an anchor cable of an insulator or tower beam for a power transmission line.

17 Claims, 3 Drawing Sheets

CURRENT SURGE INDICATOR

This application is a continuation-in-part of application Ser. No. 005,456 filed Jan. 19, 1993, now abandoned.

FIELD OF THE INVENTION

The present invention relates to an electrical current surge indicator for a conductor, such as insulator anchors, lightning rods, the ground side of a surge element, or circuit wires. The invention relates further to an electrical current surge detection method and indicator provided on the conductor which is triggered by an increase in ferromagnetic attraction as a result of the current surge.

BACKGROUND OF THE INVENTION

Current surge indicators using a magnetic drive are known as in Soviet Patent 1,215,068 (86.02.28).

In suspended power transmission lines which are suspended by insulators connected to grounded towers, ground faults as a result of insulator flashover or failure are common. When these ground faults occur, the transmission line overload protection circuits may detect the surge of current and shut down the entire line. Since the insulator flashover may occur without damaging the insulator and leaving a noticeable indication of where the flashover occurred, the power line may be put back into use without maintenance personnel being able to detect where on the transmission line the failure occurred. In the case of insulator failure, it is difficult to locate the faulty insulator for replacement purposes. Detailed visual inspection of all insulators may be required. In the case of lightning striking a tower, it is useful to know where the lightning struck to check whether any permanent damage to the tower, insulator or transmission line has occurred.

Therefore, it is important to provide a way to indicate on which power transmission line or on which insulator anchor line a current surge has occurred in order to indicate where the ground fault took place.

SUMMARY OF THE INVENTION

It is therefore an object of the present invention to provide an electrical current surge indicator which can be applied directly to an insulator anchor or other conductor to provide an indication that a current surge took place in the conductor. Since the indicators may need to be located at regular intervals, such as at every insulator along transmission lines, it is a further object of the present invention to provide a current surge indicator which is inexpensive to build and to install.

According to the invention there is provided an electrical current surge indicator for a conductor, the indicator comprises at least one ferromagnetic member having two ends, holding means for holding the at least one member around the conductor and signalling means for providing a signal when the magnetic field exceeds a predetermined threshold. The at least one member is held around the conductor with the ends in proximity and facing each other in a direction transverse to a direction of current flow in the conductor. The ends have a gap therebetween, and a magnetic circuit is created in the member and a magnetic field is formed in the gap as current passes through the conductor. In this way, a current surge in the conductor will increase the magnetic field above the threshold, and the signal aids in locating where the current surge took place.

The at least one ferromagnetic member may be hinged or resilient to allow the two ends to move towards one another under the attraction resulting from the magnetic field and at least partially close the gap, and the signalling means can then be connected to the at least one ferromagnetic member to provide either an electrical or visual signal resulting from the movement of the ends. Alternatively, a Hall effect transducer or other magnetic field sensor could be placed in the gap and drive an electrical signal from the magnetic field appearing in the gap.

Preferably, the attraction of the two ends resulting from the magnetic field causes the ends to move towards one another against the action of a spring which may be provided by flexion of the member itself or by providing an additional spring, and once the ends are moved towards one another, detent means are released thereafter allowing the member to pull away from the conductor once the surge-current ceases, the released ferromagnetic member providing a visual indication that there has been a current surge.

The invention also provides a electrical current surge indicator for a conductor comprising at least one ferromagnetic member having two ends, the at least one member being provided close to and around the conductor, the ends being in proximity, facing each other in a direction transverse to a direction of current flow in the conductor and having a gap therebetween, a magnetic circuit being created in the member and the magnetic field being formed in the gap as current passes through the conductor, and signalling means for providing a signal when a magnetic field at the ends exceeds a predetermined threshold. In this way, a current surge in the conductor will increase the field above the threshold, the signal aiding in locating where the current surge took place.

According to the invention, there is also provided a method for detecting a current surge in a conductor and signalling a current surge event. The method comprises the steps of providing at least one ferromagnetic member having two ends, positioning the at least one member close to and around the conductor, the ends being in proximity, facing each other in a direction transverse to a direction of current flow in the conductor and having a gap therebetween, and producing a signal indicative of a current surge in response to a magnetic field present in the gap as a result of the current.

Preferably, the at least one ferromagnetic member comprises two members articulated together, and the step of producing the signal comprises detecting movement of the ends of the two members together as a result of attraction caused by the field.

BRIEF DESCRIPTION OF THE DRAWINGS

The invention will be better understood by way of the following nonlimiting description of a preferred embodiment of the invention with reference to the appended drawings in which.

DETAILED DESCRIPTION OF THE PREFERRED EMBODIMENT

Figure 1:
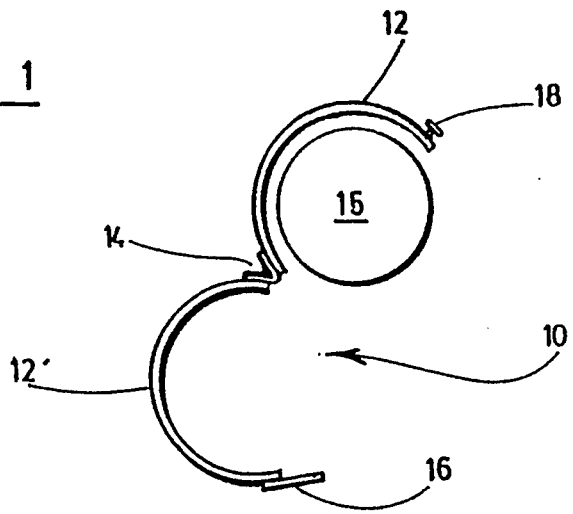
FIG. 1 is a cross-sectional diagram of the indicator according to the preferred embodiment in the open position after a current surge has occurred.
Figure 2:
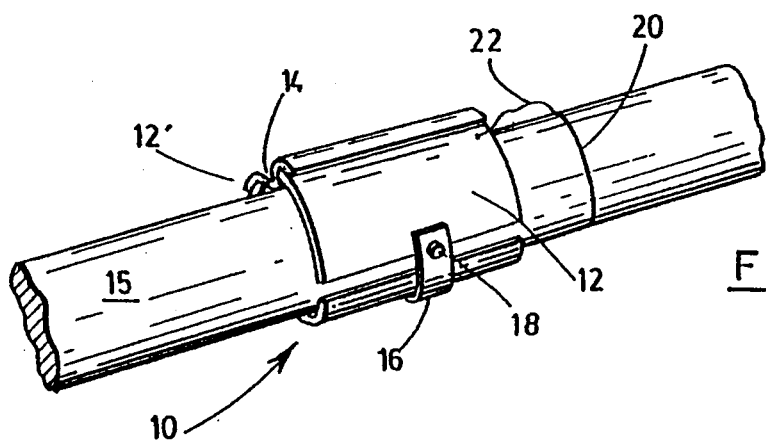
FIG. 2 illustrates a side view of the surge indicator according to the preferred embodiment in the closed position as mounted on a conductor.
Figure 3:
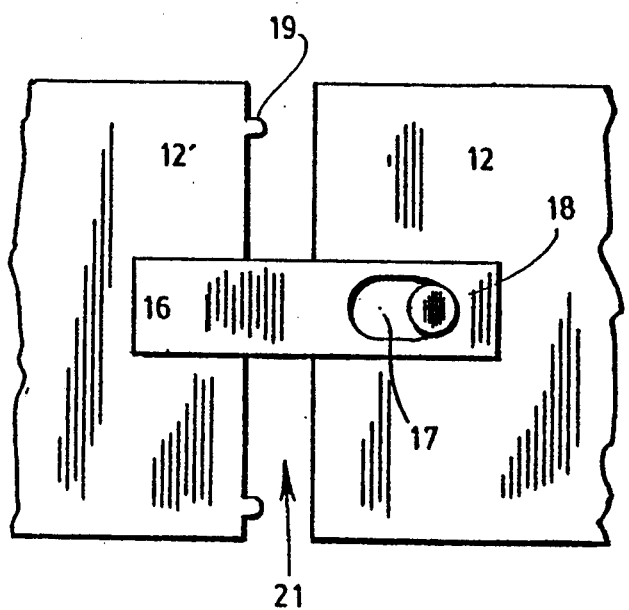
FIG. 3 is a detailed view of the locking tab and detent pin according to the preferred embodiment.

As shown in FIGS. 1, 2 and 3, the electrical current surge indicator (10) according to the preferred embodiment comprises two half-cylindrical shells (12) and (12') made from relatively thin galvanized steel, which are hingedly held together by a resilient, non-corrodible strip hinge (14) made of a copper beryllium alloy. A gap (21) is formed between the sheet ends. The sheet (12) is provided with a detent pin (18) and sheet (12') with a tab (16) as shown. The two sheets (12) and (12') are resiliently biased by spring (14) to open up and fall from conductor (15) which may be an insulator anchor line. Preferably, spring (14) causes the sheets (12) and (12') to open through the largest angle possible.

Sheets (12) and (12') are placed around conductor (15) and closed up against the action of spring (14) to surround cable (15). The straight resilient tab (16) is then bent inwardly such that pin (18) passes through hole (17) in tab (16) as shown in FIG. 3. Without releasing tab (16), sheets (12) and (12') are released, and under the action of spring (14) sheets (12) and (12') separate thus locking hole (17) of tab (16) under the lip of pin (18). Tab (16) may also be made of a copper beryllium alloy. As the current flows through transmission line (15), a magnetic circuit is created, and sheets (12) and (12') become magnetized since the steel is a ferromagnetic material. The magnetic field creates an attraction between the ends of sheets (12) and (12'). At the end where spring (14) is provided, no motion of the sheets (12) and (12') can take place, and the attraction at the open ends of sheets (12) and (12') exerts a force against the action of spring (14). The characteristics of spring (14) are chosen such that for the given dimensions and materials of sheets (12) and (12') as well as the gap (21) between sheets (12) and (12') as shown in FIG. 3, the magnetic attraction between sheets (12) and (12') will be great enough to cause them to move towards one another against the action of spring (14) when the current exceeds a given limit, when the magnetic circuit will be deformed. This limit would be above the maximum operating current level of a transmission line conductor, or in the case of an insulator anchor, the limit can be any current value below the expected fault current. When such a current surge occurs, the attractive force between sheets (12) and (12') exceeds a predetermined threshold and causes them to move towards one another allowing pin (18) to fall into hole (17) thus releasing the resilient tab (16) from detent pin (18) leaving apparatus (10) in a state where sheets (12) and (12') are closed around cable (15) with tab (16) released from pin (18).

Sheets (12) and (12') are prevented from coming any closer together than is necessary to release the tab from the pin due to the size of the cable (15), however, abutment tabs (19) or a non-magnetic stopper member (19) (see FIGS. 4 and 5) is placed on one end of the sheets to prevent them from getting too close, in case the indicator (10) is used with a slightly smaller conductor. Since it is possible that the surge current creates a permanent magnetization in the sheets (12, 12'), the stopper member (19) can be used to prevent the sheets from staying stuck together. When the line current returns to normal or zero, or when the discharge or fault current is over, as the case may be, the action of spring (14) is to swing sheets (12) and (12') apart allowing them to fall off cable (15) as a visual indication that the current surge took place in the transmission line where the indicator (10) was located.

In the preferred embodiment, the indicator (10) is also provided with a tether (22) and a tether anchor (20) so that when the indicator (10) falls from cable (15), it only falls a safe distance. Also, when indicator (10) is hanging from cable (15) on tether (22), a visual indication of the point where the surge took place is made visible from great distances, which is especially useful when used on a tower support for suspended power transmission lines.

As can be understood, the action of spring (14) combines with tab (16) and pin (18) to provide a preloaded condition to resist the force of magnetic attraction between the open ends of sheets (12) and (12'). The gap (21) between the open end of sheets (12) and (12') is set such that the overcurrent will create a magnetic attraction sufficient to draw the sheets together against the preloaded force of spring (14). Once the force threshold is reached, the movement of sheets (12) and (12') together occurs easily and quickly thus allowing tab (16) to be quickly released.

It can also be appreciated that in the preferred embodiment the construction of indicator (10) comprises only four different parts which are assembled together by brazing, dimple locks, spot welds or rivets to provide an inexpensive unit. Cost reduction is particularly important when many surge indicators are used for long distance transmission lines having many insulator anchor lines. The indicator (10) is reusable, and once triggered by an overcurrent the indication provided, namely the opening, falling and hanging of indicator (10), provides a clear visual signal or indication that the current surge has occurred. To reduce assembly costs, hinge (14) and tab (16) may be made from the same strip of Cu Be alloy, plastic or other suitable, non-corrodible material.

It is furthermore possible to provide in the arrangement of the preferred embodiment a thin wrapping or coating of a colorful or reflective material around cable (15) which is normally covered by sheets (12) and (12'), and then uncovered once the surge occurs, such that the covering can provide a clear visual indication at great distances. Work crews can then spot where the overcurrent occurred, and then tend to the necessary repairs and reinstalling of the current surge indicators (10). Of course, the attention attracting material can be provided on the inside of sheets (12) and (12').

Figure 4:
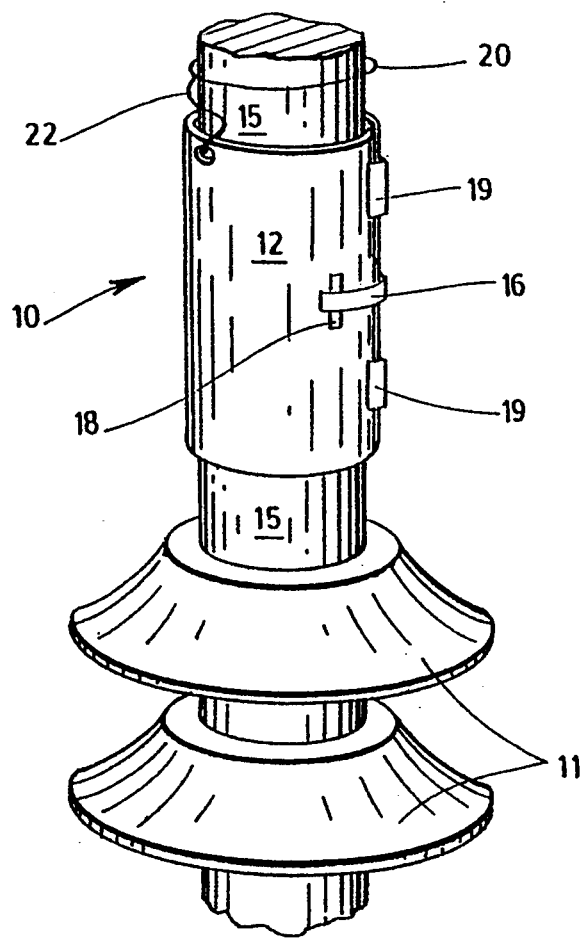
FIG. 4 is a perspective view of an alternative embodiment in which one resilient ferromagnetic sheet wraps around the conductor with hook and barb detent means.
Figure 5:
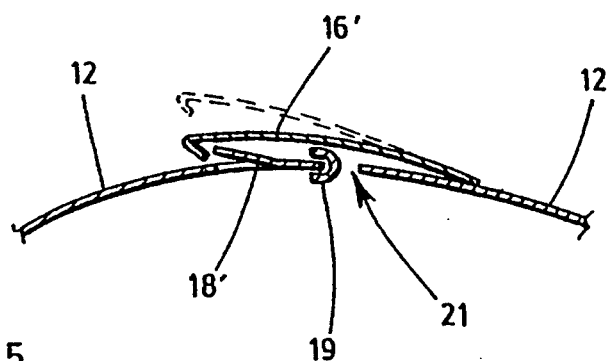
FIG. 5 is a detailed side view of the detent means of FIG. 4.

As shown in FIGS. 4 and 5, the indicator (10) can alternatively comprise a single C-shaped sheet (12) wherein the sheet is flexible and resilient enough to open and close it for placing around the conductor (15). The tab (16') is provided with a bend at its end to make a hook. One end of the sheet (12) is punched to make an upstanding barb (18'). As in the preferred embodiment, the magnetic attraction between the ends of the sheet (1.2) induced by the current in the conductor will cause the ends to move together once the attraction exceeds a threshold. The plastic edge strip (19) provides abutment means which prevent the ends from getting too close. The tab (16') is then released (shown in dotted lines) from the barb (18'), and the sheet (12) will open up under its own 'spring' or resilient force once the surge current drops off. Sheet (12) hangs vertically and is connected by tether (22) to a fastener (20) around conductor (15). If there is not enough resiliency in the sheet metal of sheet (12) alone, a C-shaped reinforcing strip can be added (made of plastic or metal). As shown, the inside of sheet (12) can be painted with a fluorescent paint to make it visibly more noticeable. Insulator (11) can support a power transmission line (not shown) and conductor (15) connects insulator (11) to a tower (not shown).

As can be appreciated, the indicator (10) can be made from a single, cut and stamped sheet of flexible galvanized sheet steel in which tab (16') is preferably a narrow tab projecting from one end of sheet (12) and cut to flex from the attachment point shown. As shown in FIG. 3, the abutment means comprise edge strips (19) which are narrow abutment tabs. As long as full contact between the ends of sheet (12, 12') is avoided the chance that they will remain "stuck" together after the current surge is eliminated.

Although the means for providing a visual indication of an overcurrent has been described above according to the preferred embodiment as being the opening and falling off of the semi-cylindrical sheets, it is to be understood that the invention is not limited to such signalling means.

For example, hinge strip (14) may be directly attached to cable (15) using attachments (20). In this way, the apparatus (10) does not fall from cable (15). It is also possible to house apparatus (10) in a weatherproof housing or under a suitable awning or roof to avoid the elements and a malfunction due to icing over.

The means for providing a signal according to the invention may also comprise any visual signal triggered by the action of movement of the ferromagnetic sheets together when the force of attraction exceeds a predetermined threshold. For example, the action of the sheets moving together may act upon a sharp pin to cause a membrane to rupture when the force of attraction exceeds a given threshold, the membrane separating different fluids which when mixed will provide a clear visual indication. Such fluids may be contained in translucid containers on the sheet surfaces. Alternatively, the ferromagnetic sheets may be prevented from movement towards one another by the action of a spring which becomes denatured upon such movement to make it irreversible or other means such as a catch can be provided to make the movement towards one another irreversible, and the movement of the ferromagnetic sheets together may cause a visual indication of the movement. Such visual indication may be provided by causing a brightly colored pattern to be uncovered, as may be provided by allowing the sheets to move towards one another within a transparent housing wherein the sheets move a plurality of elongated tabs for uncovering a plurality of corresponding brightly colored strips.

In the preferred embodiment described above, the indicator is provided on an insulator anchor cable (15). Of course, the indicator may be used on a lightning rod, any line in an electrical network or on the ground side of any surge protection device. In the latter case, the "surge current" threshold may be nominally low, however the current is usually a large surge from zero to the fault current.

Figure 6:
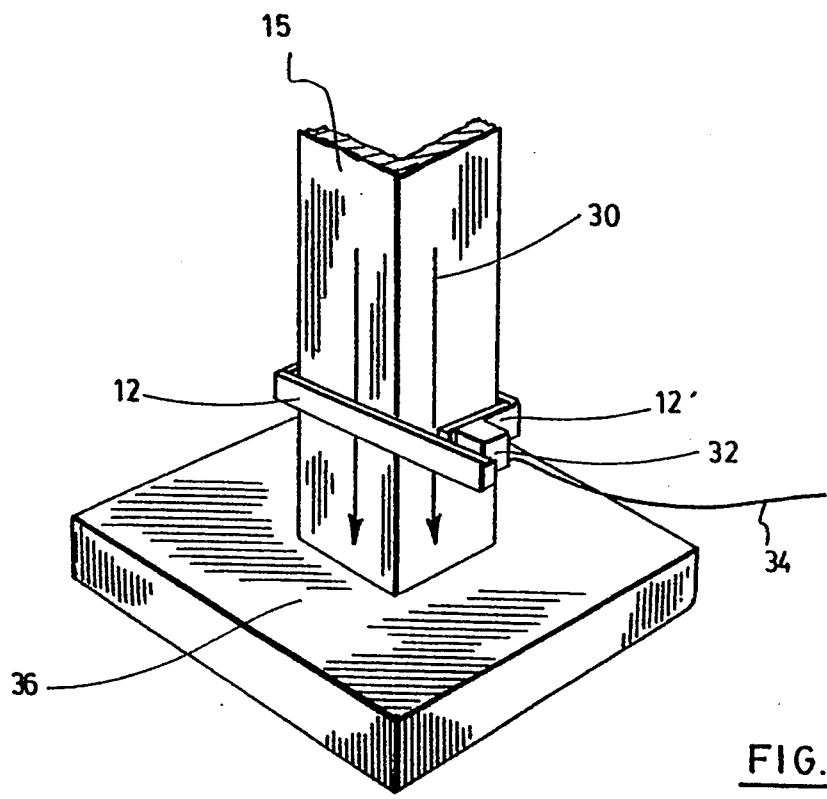
FIG. 6 is a perspective view of an embodiment incorporating a switch.
Figure 7:
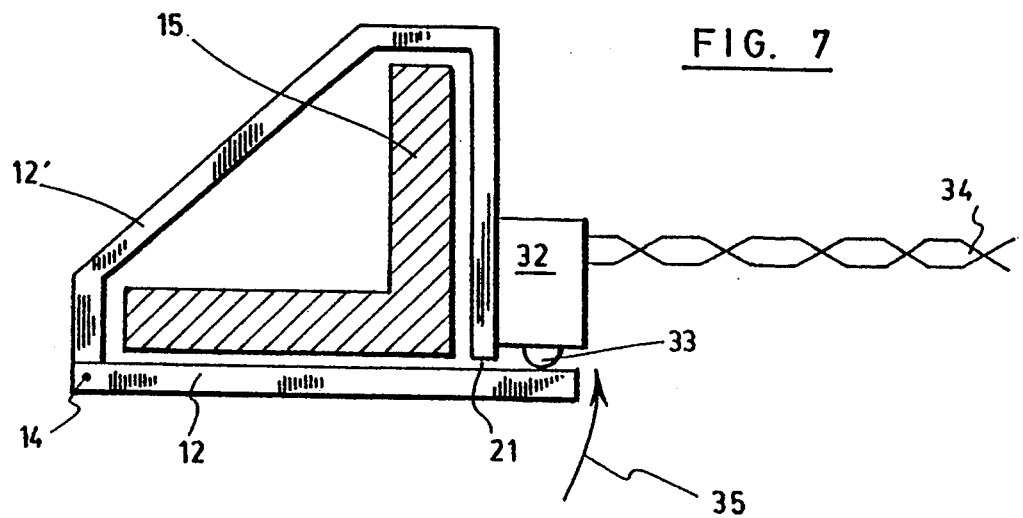
FIG. 7 is a cross-section of the installation of the embodiment of FIG. 6.

In the embodiment illustrated in FIG. 6, a straight ferromagnetic bar member (12) is hinged to a ferromagnetic bar member extending around the L-shaped conductor (15) which in the embodiment of FIGS. 6 and 7 is a conductive support structure for an electrical transmission line. The ferromagnetic bar members will produce a magnetic field induced by current (30) passing downwardly along conductor (15) into a concrete base (36). The induced magnetic field results in an attraction at gap (21) between opposed ends of members (12) which is sufficient to depress a contact button (33) of a signal switch box (32) to provide an indication signal on line (34). The hinge (14) is designed to allow the magnetic flux to pass therethrough so that there is a magnetic circuit in members (12) with only a single gap (21). For purposes of clarity of illustration, the holding means which hold members (12) and (12') around conductor (14) are not illustrated in FIGS. 6 and 7. In practice, the holding means can comprise any support or bracket for holding members (12) and (12') in position, either connected to or wrapped around conductor (15) or supported by base (36). In the case that members (12) and (12') would provide a path of conduction for current (30) such that too little current would pass in or along conductor (15) and therefore induce a magnetic field in ferromagnetic members (12) and (12'), means can be provided to ensure that current (30) stays within conductor (15). For example, the holding means may insulate members (12) and (12') from the conductor surface (15).

As can be appreciated, the use of a switch (32) and (33), either electrical, electrooptic or Hall effect can be used to provide a signal as a result of the magnetic field being concentrated at the air gap (21). In the case of a Hall effect switch, the switch is placed in the air gap (21) to feel the greatest magnetic field.

Of course, the gap (21) need not be completely an air gap but could be filled with a sponge material and still operate a switch button (33) or release mechanism (16), (18), or it could be filled with a solid material containing the magnetically actuated switch provided that the solid or sponge material does not substantially interfere with the magnetic field.

We claim:

1. An electrical current surge for a conductor, the indicator comprising:

at least one ferromagnetic member having two ends;

holding means for holding said at least one member around said conductor with said ends in proximity, facing each other in a direction transverse to a direction of current flow in said conductor and having a gap therebetween, a magnetic circuit being created in said member and forming a magnetic field being formed in said gap as current passes through said conductor; and signalling means for providing a signal when a magnetic field in said gap exceeds a predetermined threshold;

wherein:

said two ends are mobile and move towards one another when said magnetic field exceeds said predetermined threshold, and said signalling means comprise a spring for keeping said ends biased apart, and detent means for preventing said ends from moving apart under the action of said spring, said detent means being released when said magnetic field exceeds said threshold, whereby a current surge in said conductor will increase said field above said threshold, and cause said ends to move towards each other and thus to release said detent means, thereby causing said at least one member to fall away from said conductor when said detent means have been released, and thus to give said signal which aids in locating where the current surge took place.

2. Indicator as claimed in claim 1, further comprising a pivot connecting two said ferromagnetic members.

3. Indicator as claimed in claim 1, wherein said detent means comprise a resilient tab on the exterior surface of one of said ends, said tab being biased outwardly with respect to said conductor.

4. Indicator as claimed in claim 3, wherein said detent means further comprise a detent pin provided on an exterior surface of another one of said ends, said tab being provided with a hole for receiving said detent pin, whereby said tab is held against said detent pin under the action of said spring, and when said force exceeds said threshold, said resilient tab is released from said detent pin as said ends move closer together, thus allowing said ends to thereafter separate when said force decreases below said threshold.

5. Indicator as claimed in claim 3, wherein said tab is provided with a hooked end, and said detent means further comprise a barb provided on another one of said ends, said hooked end engaging said barb, whereby said hooked end is held against said barb under the action of said spring, and when said force exceeds said threshold, said resilient tab is released from said detent pin as said ends move closer together, thus allowing said ends to thereafter separate when said force decreases below said threshold.

6. Indicator as claimed in claim 3, wherein said at least one member comprises two sheets, said ends being one end of each of said two sheets, said sheets being connected together by a hinge provided at other ends of said sheets.

7. Indicator as claimed in claim 6, wherein said at least one member is a resilient sheet wrapped around said conductor.

8. Indicator as claimed in claim 7, wherein said detent means comprise a hooked tab and an engaging barb, said tab and said barb being formed integrally with said sheet.

9. Indicator as claimed in claim 7, wherein said resilient sheet is made of galvanized steel.

10. Indicator as claimed in claim 3, wherein said tab is made of plastic.

11. Indicator as claimed in claim 3, wherein an inside of said at least one member is provided with a visually attention attracting surface.

12. Indicator as claimed in claim 1, wherein an inside of said at least one member is provided with a visually attention attracting surface.

13. Indicator as claimed in claim 1, further comprising abutment means connected between said ends for preventing said ends from reaching such close proximity that said force remains greater than the action of said spring even as said current drop below a level which originally created said field above said threshold, whereby if said conductor usually carries a normal current or if said ferromagnetic becomes magnetized as a result of said current, said field will not remain above said threshold after said surge.

14. Indicator as claimed in claim 13, wherein said abutment means comprise at least one plastic stopper provided over at least one edge of said ends.

15. Indicator as claimed in claim 1, further comprising a tether connected to said indicator and means for attaching the tether to said conductor.

16. Indicator as claimed in claim 1, wherein said spring is a strip of non-corrodible resilient material for connecting said other ends of said sheets together.

17. Indicator as claimed in claim 16, wherein said sheets are made of galvanized steel.

* * * * *